United States Patent [19]

Smith et al.

[11] Patent Number: 4,976,392
[45] Date of Patent: Dec. 11, 1990

[54] ULTRASONIC WIRE BONDER WIRE FORMATION AND CUTTER SYSTEM

[75] Inventors: Michael C. Smith; Hal W. Smith, Jr., both of Costa Mesa, Calif.

[73] Assignee: Orthodyne Electronics Corporation, Costa Mesa, Calif.

[21] Appl. No.: 392,435

[22] Filed: Aug. 11, 1989

[51] Int. Cl.$^5$ .............................................. B23K 20/10
[52] U.S. Cl. ..................................... 228/102; 228/111; 228/1.1; 228/8; 228/13
[58] Field of Search ............... 228/102, 110, 111, 179, 228/1.1, 4.5, 8, 13; 219/56.21, 137.8, 85.18

[56] References Cited

U.S. PATENT DOCUMENTS

| | | | |
|---|---|---|---|
| 3,460,238 | 4/1967 | Christy et al. | 228/1.1 |
| 4,239,144 | 12/1980 | Elles et al. | 228/1.1 |
| 4,418,858 | 12/1983 | Miller | 228/4.5 |
| 4,550,871 | 11/1985 | Chan et al. | 228/4.5 |
| 4,619,397 | 10/1986 | Urban | 228/1.1 |
| 4,789,095 | 12/1988 | Kobayashi | 228/110 |

FOREIGN PATENT DOCUMENTS

| | | | |
|---|---|---|---|
| 91533 | 6/1982 | Japan | 228/4.5 |
| 219533 | 9/1987 | Japan | 228/1.1 |
| 462682 | 3/1975 | U.S.S.R. | 228/1.1 |
| 493317 | 3/1976 | U.S.S.R. | 228/110 |

OTHER PUBLICATIONS

*IBM Technical Disclosure Bulletin*, "Cutting Fine Lead Wires . . . ", vol. 10, No. 3, p. 190, Aug. 1967.
*IBM Technical Disclosure Bulletin*, "Ultrasonic Bonding Tip", vol. 10, No. 12, p. 1892, May 1968.

*Primary Examiner*—Sam Heinrich
*Attorney, Agent, or Firm*—George F. Bethel; Patience K. Bethel

[57] ABSTRACT

An improved ultrasonic wire bonding method and apparatus is disclosed having a wire delivery conduit for removing coil set in the wire through a serpentine movement prior to being bonded, which also provides sufficient drag to prevent displacement as the bonder with the wire is being moved from one location to another, and which orients the wire to said bonding tool end. An improved wire cutter moves independently of the wire bonding tool and is directly connected to the main Z positioning movement of said wire bonder so that the wire bonding tool and the cutter can move independently during the process. The wire bonding tool can be biased by a magnetic bias with an armature connected to the wire bonding tool. The wire bonding apparatus and the method provide a loop in the wire between first and second bonds by forming an arcuate bend in the wire as it moves away from the first point of bonding. After a second bond, the wire is partially cut by a cutter that moves relative to the bonding tool to partially cut the wire which is then severed by pulling the bonding tool and cleating the wire in the end thereof.

49 Claims, 5 Drawing Sheets

ULTRASONIC WIRE BONDER WIRE FORMATION AND CUTTER SYSTEM

BACKGROUND OF THE INVENTION

1. Field of the Invention

The field of this invention resides within the field of ultrasonic wire bonding. Ultrasonic wire bonding is known for purposes of attaching wire interconnections to semiconductor devices either by ball bonding or wedge bonding. Such ball and wedge bonding is specifically performed by ultrasonic wire bonders that are attached to a support medium that moves them into a respective location for a proper bond. This particular invention is more finely delineated to be within the wedge bonding field.

2. The Prior Art

Wedge bonding for semiconductor devices is known in the art. Such bonding employs machinery and methods with a wire oftentimes formed of aluminum. The aluminum wire is connected from one point to another. The diameter of such wire in many cases can range from between 0.001 to 0.025 inches.

The wire is pressed against the surface of a semiconductor chip with a bonding tool. The end of the tool is vibrated with ultrasonic vibrations in a plane of motion generally parallel to the surface of the semiconductor to which a bond is to be formed. This ultrasonic vibration is for a period of tens of milliseconds. The combination of a static load on the bonding tool normal to the chip's surface to which the wire is bonded and the vibration of the end of the tool parallel to the surface cause the wire to plastically deform. As the wire plastically deforms, it simultaneously joins with the atoms of the material composing the chip's surface to provide a cold weld.

The invention hereof has two major elements. Firstly, it comprises a method of controlling the position and formation of the bonding wire and secondly a method for cutting the wire after the last bond. Other methods are currently used. This invention obviates those methods by eliminating the need for additional active devices. Instead it uses the basic mechanism of the equipment itself with the novel method hereof to perform both tasks of holding the wire and cutting it.

A common feature of many wedge bonding machines and tools is a clamp to hold the wire in a proper position under the tool tip. This is necessary while the tool is moving from one point where one wire has been terminated to a point where a second wire will be bonded. This prevents the wire from being removed from the tip while maintaining it for the second bond. Such a clamp is generally an active device employing a solenoid connected to a pair of jaws forced to open and close on command with respect to the particular bonding position or placement of the wire. Such a holding of wires is generally effective. However, the solenoid adds mass to the bonding head assembly that must be low in mass for fast operation and to minimize wire flattening from deceleration forces as the wire is pressed against the work surface.

The concept of such an active clamp also requires drive circuitry and means to supply the energy to the solenoid. The clamp is a necessary but troublesome feature of a bond head. It has been thought that if a method for eliminating it could be employed, wire bonding could be substantially enhanced.

Another drawback is that the clamp oftentimes occupies space behind or near the wire bonding tool. This restricts the use of the bonder to relatively open space areas clear of other components. This is due to the tool and clamp requiring space in which they can penetrate when moved to a component.

In order to avoid the occupying of space behind the tool, some equipment designs feature clamping means remotely positioned from the tool. This is somewhat disadvantageous inasmuch as the further the clamp is positioned from the tool, the more difficult it is to maintain a proper tail length to the wire after it has been bonded. The bond tail is that portion of unbonded wire projecting ahead of the first bond on a wire. This tail should be as short as practical, yet not less than the desired length of the bond.

The invention hereof eliminates the need for a separate clamp power source. The invention occupies a small space above and behind the bonding tool. This permits access into restricted space occupied by other elements of the component.

Additionally, the invention removes spool set or curvature to the wire caused by the wire having been coiled onto relatively small diameter spools. This is most important for accurate wire handling and positioning.

The invention further improves loop formation in the wire between bonds. This is desirable to avoid stresses in the wire lead and ultimately to device failure. If the loop is properly formed, it allows for expansion and contraction movements. Thus, proper loop formation is desirable and is enhanced significantly by this invention.

Repeatable looping requires bending the wire slightly but continuously as the tool rises from the first bond point. This minimally sets or bends the wire so that it will bend still further in the same direction as the machine moves between the first bond point and second bond point. It is important that the condition of the wire with respect to prior coil set be uniform. In measurable effect, uniform loops will occur if the axial orientation of the coil set is contant. Current bonders sometimes have the wire twist between spool and tool, thus affecting the initial condition of the wire and hence the loop shape.

The same mechanism that normalizes the wire with respect to coil set also provides a very low and controlled drag on the wire as the wire pays out between bonds. This drag is sufficient to serve the same purpose as the wire clamp used in the prior art. Those designs clamped the wire between jaws when necessary to hold it during moves between successive wires. A drag force in excess of any force that would cause the wire to slip or be drawn by gravitational forces with respect to the tool is sufficient. The invention incorporates a simple passive drag system in place of a more complicated active wire clamp.

After initial bonding, withdrawal of wire from the spool, and the provision of the loop formation, the wire is then placed in a position for the bonding operation at a second location. At this second location, after bonding, the wire is then cut by means of a cutter. The cutter is a significant improvement over all prior bonding cutters as shall be shown hereinafter. It has a knife edge that drives against the surface of the wire to be cut without having attendant solenoid drive means and other devices for cutting the wire. It furthermore moves in relative relationship to the bonding tool so as to allow to cut without displacing the tool.

After the wire is cut, the wire can then be severed while simultaneously implacing the wire in a slot or groove at the end of the tool. This serves to cleat the wire in the tool so that it can then be placed for a subsequent bonding operation.

A further feature allows the cutter to move against a flexible underlying substrate to a relative position with said bonding head to provide a sufficient depth of cut. Afterwards the wire can then be severed.

All the foregoing features and advantages over the prior art shall be seen hereinafter in the description of the apparatus and method in conjunction with the drawings as set forth.

SUMMARY OF THE INVENTION

In summation, this invention comprises a wire bonder having a wire normalizing device for eliminating coil set to a wire, which thereafter pre-establishes a set for more consistent wire loops between bonds, and low, consistent drag to hold the wire with respect to the tool. This is accomplished by a serpentine conduit or path through which the wire must pass before it approaches the bonding surface of the tool.

The conduit is generally behind the wire bonding tool with the exit point slightly above and behind the bottom of the tool. The serpentine conduit is attached to a transducer assembly and remains in a constant relative position with the tool, even though the tool moves in an X, Y and Z axis, as well as rotating through a rotational axis through an angle theta (T) of 200°.

Following bonding, the tool and sepentine conduit are raised upwardly to a position called "loop stop". This distance is a function of the distance to the next bond with an additional amount of wire to provide the service loop in the wire span. As the tool is raised with the serpentine conduit, wire pays out of the conduit curving toward the tool as it bends around the lower exit opening of the conduit. No additional wire will pay out after reaching "loop stop". The controlled drag is sufficient to prevent payout, or the reverse, namely wire backing up.

Following the last bond, the head continues downwardly until a blade on the bond head cuts through the wire at the rear face of the tool. By controlling the vertical motion of the bonding head to fractions of one thousandth of an inch, accurate cutting depth can be easily maintained by the cutter. The bonding head then moves up to draw out enough wire from the conduit for the next bond. The tool then moves backwardly (about one bond length) and downwardly to capture the wire in the tool. After cutting and raising the bonding head to draw out the wire, the tool is lowered slightly above the work and moved backwardly to complete the break. The machine is then ready for another series of wire bonds incorporating the foregoing features.

Specific features of this invention incorporate a cutting of the wire with a discretely oriented cutter as regards the bonding tool. In other words, the cutter is controlled for relative movement with respect to the bonding tool, in order to prevent inordinate depths of a cut. This is controlled by a limit switch.

The foregoing features allow a bond and subsequent cutting and severance of a wire on a flexible substrate. Another enhanced feature is the cleating and maintenance of a wire in a bonding tool to prevent its disassociation as the tool and head are moved to another location.

The effect and unique aspects of the invention as to its improved functions, apparatus and elements shall be described in greater detail hereinafter.

BRIEF DESCRIPTION OF THE DRAWINGS

The invention will be more clearly understood by reference to the description below taken in conjunction with the accompanying drawings wherein.

DESCRIPTION OF THE PREFERRED EMBODIMENTS

DESCRIPTION OF THE APPARATUS AND ALTERNATIVE EMBODIMENTS

Figure 1:
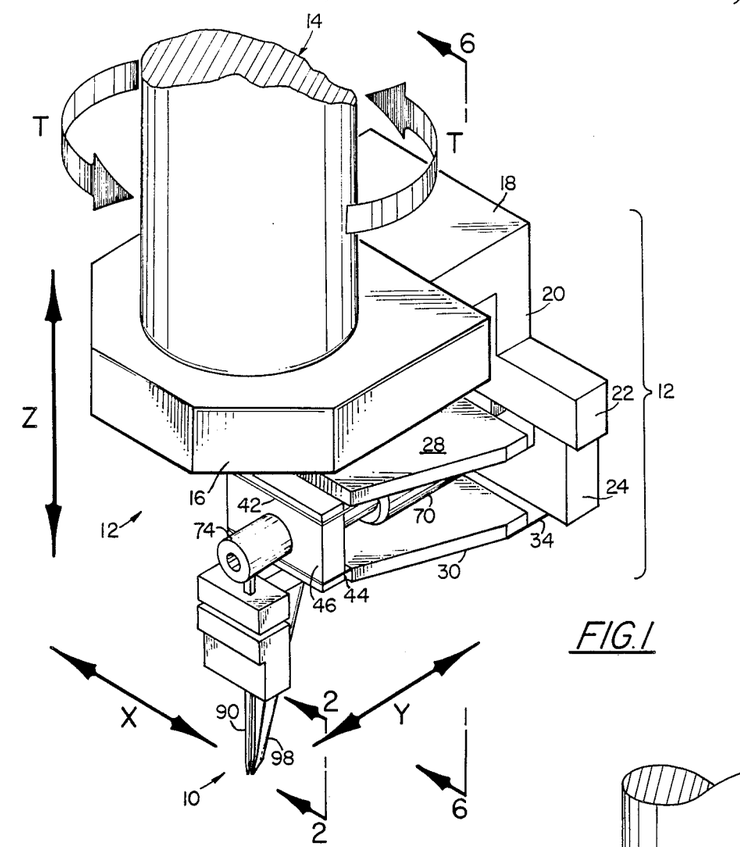
FIG. 1 shows a perspective view of the apparatus of the invention hereof with the various directions of movement exemplified as X, Y, Z and rotational movement theta (T).

FIG. 1 shows a perspective view of the apparatus of this invention in the form of a bonding head 10 and main support apparatus 12. The main support apparatus 12 is held by a securement table or platform, or forms part of an in-line process for bonding wires to semiconductors or electronic components. The bonding head 10 is attached to the main support apparatus 12 and is driven and controlled by electronic and electro-mechanical apparatus. The entire device can be driven and controlled in conjunction with a computer which can be programmed to move the head and the apparatus in the manner as set forth hereinafter.

The bonding head 10 is supported by the main support apparatus 12, which is held and controlled by a cylindrical tube 14 which can be the mechanical ground for the operative movements of the bonding head 10. The cylindrical tube 14 is a rotary tube or cylinder that is supported and held by a brace or bracketed holder which is not seen. The entire tube or cylinder 14 is borne within a combined linear rotary bearing and can be referred to as a linear bearing tube which is not shown.

The linear bearing supports the tube 14 and the main support of the bonding rotary apparatus of this invention to allow it to move in the X, Y and Z directions as shown. It also rotates in the rotational mode theta (T). The X, Y and Z directions as shown are such where the bonding head 10 moves along with the rotary linear bearing assembly as connected to the tube or cylinder 14. In order to move over the surface of the semiconductor, the tube 14 can rotate in the direction of theta (T) as shown by the circular arrows.

Attached to the rotary linear bearing tube 14 is a block, clamp or support member 16. The block 16 is secured to the rotary linear bearing tube 14 by any suitable means. In this particular instance, it is shown as a chamfered block 16. The block 16 can be secured by having a split at any portion thereof tightened around the tube 14 by a tighting screw so that it can be tightened around the circumference of the linear bearing tube 14, thus deriving the alternative designation "clamp".

Attached to and forming a portion of the clamp support member or block 16 is a rear bracket 18 extending therefrom. The rear bracket 18 extending therefrom has a downwardly depending portion 20. The downwardly depending portion 20 extends downwardly, to hold a flexure mount. The downwardly depending portion 55 terminates in a first lateral member 22 and a second lateral member 24. These respective lateral members 22 and 24 are such wherein they provide for a flexural securement that will be detailed hereinafter.

The lateral members 22 and 24 support the operational portions of the support arm of the bonding tool and wire forming conduit as will be detailed hereinafter. Also, the transducer and horn for ultrasonic vibration of the bonding tool are supported thereby.

Figure 6:
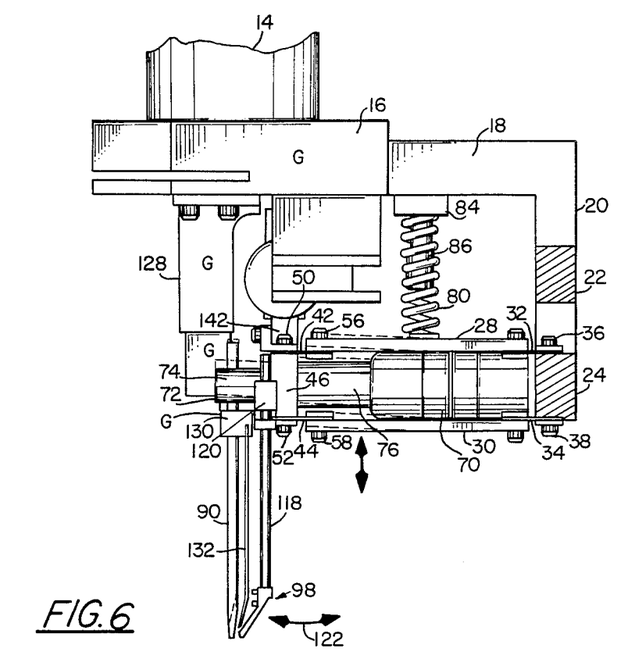
FIG. 6 shows a side elevation view as seen in the direction of lines 6—6 of FIG. 1.
Figure 16:
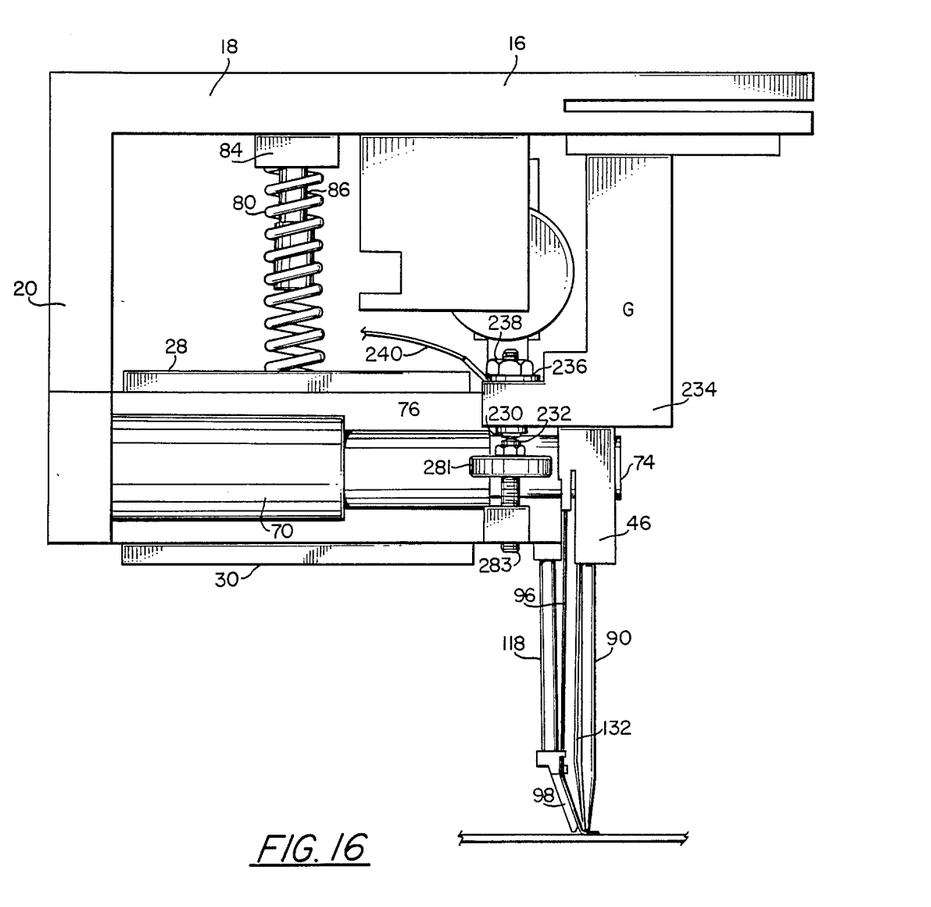
FIG. 16 shows a side elevation view of the support means and bonding head in an opposite view from that shown in FIG. 6.

Looking more particularly at FIG. 6 in conjunction with FIGS. 1 and 16, it can be seen that the lateral support member 24 supports the bonding tool and wire conduit by means of a four bar connection. This four bar connection is formed by means of an upper plate 28 and a lower plate 30. These upper and lower plates 28 and 30 are fundamentally extension arms of a four bar connection.

The four bar connection comprises flexural connecting spring-like leaf members 32 and 34 as connected to bracket 24. These flexural spring members 32 and 34 are secured to the lateral bar 24 by means of screws 36 and 38 connecting them to the lateral support bracket 24. The two respective plates 28 and 30 are connected to a point not seen by a second series of symmetrical springs or leaves hidden in FIG. 6 behind springs 32 and 34. The second set of springs are at a point removed and attached in like manner to the lateral bracket 24 in the same bilateral position as shown in FIGS. 1 and 6 as those springs 32 and 34. They are hidden also from view in FIG. 1 by block 10 but are removed in the same symmetrical location to the left side of the figure.

The plates or arms 28 and 30 taper inwardly along their edges as seen in FIG. 1 and are connected by single flexural springlike members 42 and 44. The single springlike flexural members 42 and 44 are clamped in adjacent relationship to a transducer holder 46. The transducer holder 46 is held in place on either side of the flexures 42 and 44 by means of screws 50 and 52.

The plates 28 and 30 are secured to the other ends of flexural springs 42 and 44 by means of screws 56 and 58. The foregoing connections of the screws 50, 52 and 56 and 58 are not detailed in FIG. 1 for purposes of simplification.

Looking more particularly at FIG. 6, it can be seen that the two respective bars or arms 28 and 30 are held in a flexing position so that they can bend upwardly and downwardly. This bending upwardly and downwardly has been shown in a dotted configuration.

Attached to the transducer holder 46 is a transducer 70. The transducer 70 is connected to a current source in order to provide for oscillatory driving movement. The oscillatory movement is delivered in the direction of the Y axis as seen in FIG. 1 and serves to propagate a wave through an ultrasonic horn generally shown as horn 72. The ultrasonic horn 72 comprises three repsective portions. In particular, it comprises a portion 74 to which an ultrasonic bonding tool is connected. The portion 74 is connected to the transducer holder 46 and to an enlarged portion 76. The enlarged portion of the horn 76 is in turn connected to the transducer 70 for ultrasonic vibration.

Ultrasonic vibrational modes are provided by electrical energy delivered to the transducer to provide pulses and driving in an ultrasonic manner of the horn 72 attached thereto. The waves are propagated in the Y axis in a manner so that the waves meet at a node within the holder 46. The holder 46 fundamentally forms a point of nodal support so that the waves can propagate and meet at a node in the holder 46. The propagation of the waves down the horn 72 allows for a bonding tool 90 hereinafter described to be vibrated in a manner so that it moves at its end portion in a plane roughly parallel to which a wire is to be ultrasonically bonded.

In order to provide frictional engagement and a load on the bonding tool 90 which is supported by plates 28 and 30, a spring loading is provided. This spring loading is accomplished through a spring 80 which forces down the arms 28 and 30 with a magnetically controlled force of 50 to 1000 grams. The spring 80 itself provides roughly 500 grams of force downwardly. The spring is contained by a threaded rod 86 permanently fixed to rear bracket 18 and a pocket 88 not completely seen within the upper bar 28. Provision for adjusting the spring force is by means of an adjusting nut 84.

Figure 15:
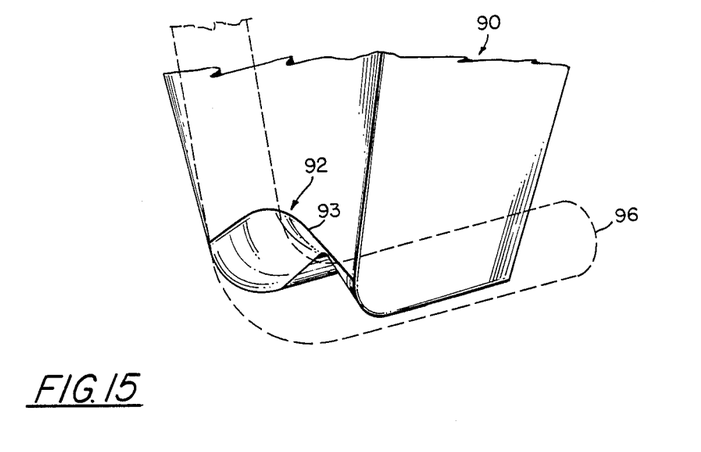
FIG. 15 shows a detailed view of the wire within the end of the bonding tool.

The bonding tool 90 is attached to the frontal horn portion 74 by means of a set screw or other means. The bonding tool 90 is generally formed of a tool steel or tungsten carbide. The tool steel or tungsten carbide bonding tool is grooved or channeled as can be seen in FIGS. 5a and 15 at groove or "V" shaped channel 92. Groove 92 is generally in the direction that is normal to the axis of the bonding tool 90.

The bonding tool 90 receives a wire 96 thereunder which it is to bond to the surface or substrate thereunder, namely a point of connection for an electronic component such as an integrated circuit. The bonding tool 90 is directly connected to the horn portion 74 for vibrational movement. In order to feed wire to the tip of the bonding tool, the wire 96 is fed through a conduit 98 having a serpentine or sinuous path. The conduit 98 has a sinuous or serpentine path that can also be a compound curve therein to allow for the normalization of the wire 96 after it is received from the storage coil.

Figure 3:
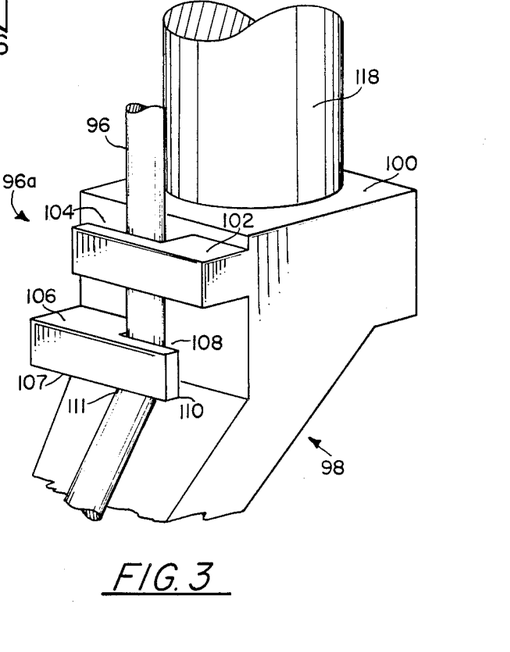
FIG. 3 shows a side perspective view of portion of the wire feed conduit as encircled by circle 3 of FIG. 2.

The conduit 98 is shown in greater detail in FIG. 3. It comprises a plastic or soft metal block member 100. The plastic or soft metal block member 100 can be formed of any particular material. However, it is felt that plastic is particularly adaptable to this application inasmuch as it does not cause wear on the wire 96 that is being fed therethrough. At the same time, it provides a sufficient amount of resistance against abrasion so that it does not deteriorate rapidly. In particular, the block 100 can be formed from a plastic generally referred to as an ultra high molecular weight polyetheylene (UHMWPE). This high density polyethylene is such wherein it does not erode the wire nor gall it. It wears at a prescribed rate in order to allow for movement of the wire therealong without scratching or affecting the wire, while at the same time providing sufficient strength and wear characteristics.

The block 100 in this case has been shown with an upper "L" shaped guide block 102 forming an opening 104 by extending over the surface of block 100 to allow the passage of wire 96 thereunder. A second "L" shaped guide block 106 is shown with a passage 108 therethrough which allows for the passage of the wire 96. This respective series of openings 104 and 108 allow for the wire 96 to pass therethrough and be formed over the inner edge region 110 of the "L" shaped block 106.

The configuration of the blocks 102 and 106 allow for the wire 96 to be threaded therein with a facile movement of the wire 96 to a position between the blocks 102 and 106. For instance, the wire 96 can be turned to a direction which is seen as basically horizontal in FIG. 3 within the space 107 between the blocks 102 and 106. When turned horizontally into that space, it can then be threaded by being received behind the blocks in the spaces 104 and 108. In order to exemplify this, a dotted wire 96a has been shown ready to be threaded into the respective spaces 104 and 108.

The surface 110 which works against the wire at approximately portion 111 of the path through which it travels can be configured by any other suitable means. For instance, the path provided through the blocks 102 and 106 can be effectuated by means of a capillary opening, a tubular path, a series of rounded cylinders over which the wire 96 can pass in a sinuous or serpentine manner, or any other path providing movement over a first surface such as surface 110 which is to work the wire in conjunction with a second surface.

Figure 2:
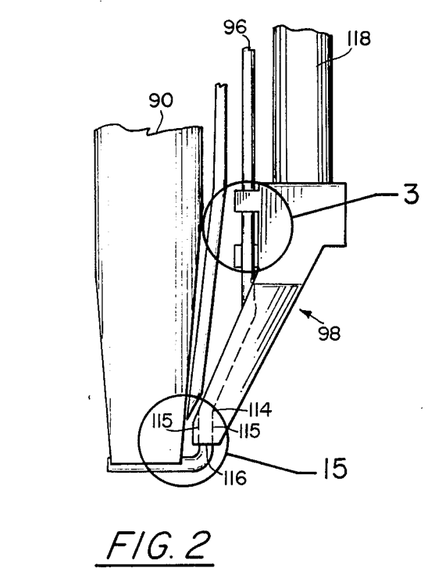
FIG. 2 is a fragmented detailed sectional view of the bonding head in the direction of lines 2—2 of FIG. 1.

A second surface 114 which has been shown in dotted configuration in FIG. 2 provides for a second working surface in the conduit 98 in order to normalize the wire 96. This second surface in conjunction with the first surface 110 causes the wire 96 to be worked on a serpentine basis. The wire 96 moves in a channel 115 shown in dotted configuration within the conduit 98 in order to hold and secure the wire 96 therein and cause it to move over the second surface 114.

Surfaces 110 and 114 can be provided by any suitable means such as a sinuous or compound curved path over which the wire 96 is threaded in displaced lateral relationship from each other. These can be formed as smooth cylinders, blocks, or other surfaces over which the wire 96 is moved.

Finally, it should be seen that the conduit 98 has a channel 115 with an opening 116. The opening 116 allows for the exit of the wire 96 to exit therefrom and to travel over the edge surface of the opening. The edge surface of the opening can be seen in greater detail in the cartoon figures of FIGS. 7 through 14 and 17 through 21.

The lower edge 114 bends the wire 96 during looping operation as set forth hereinafter. This is one of the main functions of edge 114. Channel 115 and opening 116 keep the wire aligned at the bonding tool groove and close to the rear of the tool. Channel 115 is also important during the cleating and breaking of the wire. Channel 115 keeps the angle of the wire near 90°. Without the channel 115 it is likely that the wire would bend away from the backside of the tool as the wire is pulled during the breaking move. The cleating action depends on the wire's radius being very small. Thus, these guiding aspects of spring 116 and channel 115 are very important as will be seen from the description that follows.

The conduit is supported by means of a support pin, tube, rod or extension 118.

The support 118 for the conduit 98 is on a flexible connection. This flexible support is provided at a flexing member 120 as seen in FIG. 6. The flexing member 120 is supported and flexed at the end of the four bar connection. The flexure is a continuation of flexural spring-like member 44. Flexure 44 thus has two lines of flexure; one is part of the aforementioned four-bar linkage and the other, positioned closer to the tool, for flexing the wire guide conduit assembly made up of support pin 118 and conduit 98. The flexing connection 120 can be established by a spring attachment means or a pivotal bias of any type as established through a spring point of the flexible connection 120. This allows for arcuate movement backwardly and forwardly in the direction of arrows 122.

The four bar connection plates 28 and 30 support the bonding tool 90 and the support pin 118 for the conduit 98 so that they move together simultaneously. Although the conduit 98 moves away from the bonding tool 90, it only moves in a swinging arcuate manner away from it rather than upwardly and downwardly. The flexed connection support 118 at connector 120 is only with respect to this movement of the support 118 in an arcuate manner.

The main support means 12 is supported on the tube 14 which can be considered the mechanical ground (G). This mechanical ground can be seen on the block 16 which has been labeled G for mechanical ground, as well as the downwardly depending member or ground bracket 128 that is connected in turn to a cutter holder 130.

The cutter holder 130 holds a cutter 132 by means of set screws tightly clamping the cutter. The cutter holder 130 is connected to mechanical ground (G) through the downwardly depending member which then ends up at the block 16 and finally to the X, Y, Z and Theta (T) positioning for movements of tube 14. Thus, as the tube 14 moves downwardly, it causes the cutter 132 to move consistent with the entire movement of the tube 14 and main support 12. In this manner, the mechanical ground shown as (G) with regard to all the elements is such wherein it forces movement of the cutter 132 in a direct relationship to the movement of the tube 14.

Relative movement with respect to the cutter 132 is experienced by the bonding tool 90 and conduit 98 which move independently on the four bar connection provided by the flexures 32, 34, 42 and 44 attached to plates 28 and 30. The spring 80 creates a bias on the bonding tool 90.

Additional bias is created by an armature 142. Armature 142 can be seen in greater detail in FIG. 4, but is also seen in FIG. 6 connected to the holder 46. Armature 142 causes movement of the holder 46 and the attendant flex movement of the four bar connection developed through plates 28 and 30. The armature 142 connected to the holder 46 in turn causes the support pin or rod 118 and tool 90 to move therewith. Thus, when the armature 142 is biased in one direction or the other, it can provide additive or subtractive forces to the spring bias provided by spring 80 on the tool 90. The act of lowering the bond head 10 and thus the tool 90 onto the surface of wire 96 followed by over travel causes the relative displacement of the transducer holder 46 and armature 142 relative to coils 144 and 146.

Figure 4:
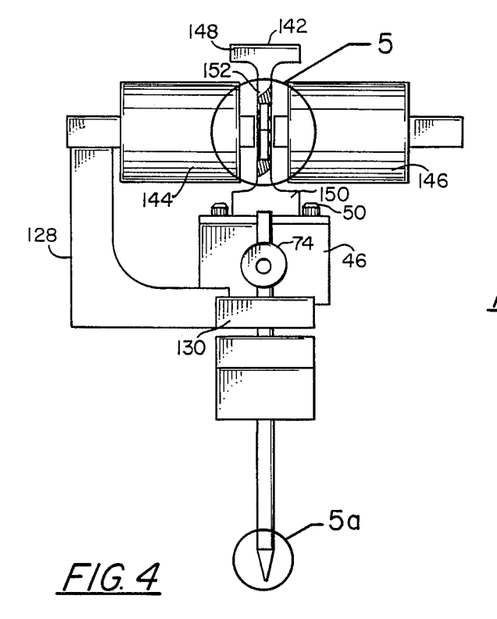
FIG. 4 shows a front elevation view of the bonding tool, biasing and support devices as seen in the frontal direction of FIG. 1.
Figure 5:
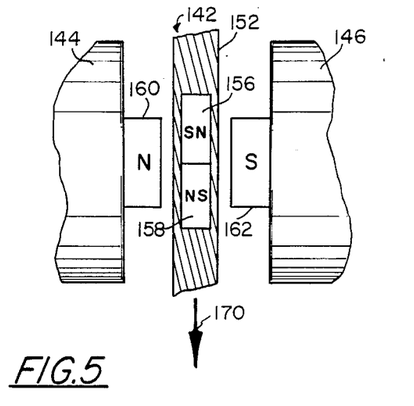
FIG. 5 shows a detailed partially sectioned view of the magnetic field load biasing device of this invention.
Figure 5A:
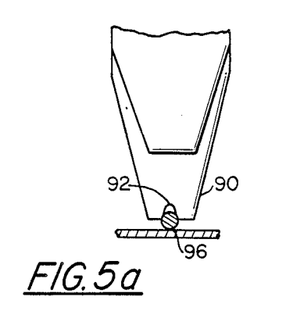
FIG. 5a shows a detailed view of the wire as it is being held for bonding purposes at the tip of the tool as shown in circle 5a of the opposite side as shown in FIG. 4.

This magnetized load of the armature is detailed in FIGS. 4 and 5. FIG. 5 shows two coils 144 and 146 connected directly by means of the clamp 16 to the tube 14. Between the two coils 144 and 146 is the I bar 142 with its transverse portions 148 and 150 connected by a web or upright 152. The web 152 or upright has a narrowed segment which receives a south-north (SN) magnet 156 and a north-south (NS) magnet 158 made of samarium cobalt.

On either side of the upright portion or web 152 on the I bar are poles of the coils 144 and 146. The poles are shown as a north pole 160 and a south pole 162 formed from a closed magnetic loop of soft iron. The polarity of the poles 160 (N) and pole 162 (S) is established by driving the coils 144 and 146 with a current in a particular direction to establish a north or south (N or S) relationship. Thus, the two foregoing poles 160 and 162 can be reversed to provide cumulative or subtractive forces with respect to the force provided by spring 80.

FIG. 5 shows the manner in which force is added to the bias force provided by spring 80. Current is passed in series through coils 144 and 146 to produce the magnetic polarity shown. The fields produced by the permanent magnets 156 and 158 and the electromagnet whose poles 144 and 146 produce a net attractive force to magnet 156 and a net repelling force to magnet 158. The sum of these forces result in force shown by arrow 170. This downward force in the direction of arrow 170 supplements the spring load provided by spring 80. This applies additional force to the end of the tool 90 against the wire 96. The four bar connection provided by the springs 42 and 44 and springs 32 and 34 and their opposite springs that are hidden in the side view of FIG. 6 create a parallel movement of the tool 90 and of course the depending support pin 118 and conduit 98 connected thereto.

The force downwardly can be increased or diminished depending upon the amount of current applied to the coils 144 and 146. The force also depends upon whether poles 160 and 162 receive a north-south relationship respectively or a south-north relationship. When receiving a north-south relationship by the direction of current flow they supplement the spring force of spring 80 by urging the I bar 142 downwardly in the direction of arrow 170. When the north-south relationship of poles 160 and 162 is reversed, it allows the force to be subtracted against the force against the upright portion of I bar, namely upright 152. This causes the force to be moved opposite from the direction of arrow 170.

The tube 14 can be oriented as shown in FIG. 1 into an X, Y, Z and T axis causing the bonding head 10 to move in those directions. The direct connection of the cutter 132 to the tube 14 causes it to move in a direct relationship thereto. The tool 90 and pin or support 118 move in a flexed manner depending upon the relationship of where the tool rests and how flexed the horn 76 is on the four bar support plates 28 and 30. Thus, they move in a relative relationship upwardly and downwardly with respect to the cutter 132 attached to the mechanical ground (G).

Figure 7:
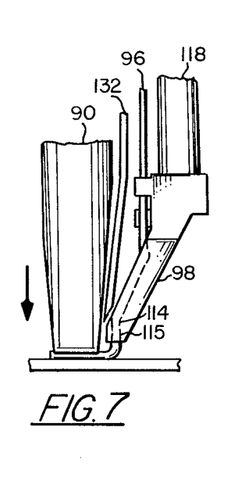
FIG. 7 shows a side elevation view of the bond head with the bonding tool, wire conduit and cutter as analogous to and as seen in FIG. 2, while the bond is being made.

Looking specifically at FIG. 7, it can be seen where the bonding tool 90 has been driven downwardly with a bias against the wire 96. This downward bias of course is caused by the spring 80 and the magnetic system shown in FIGS. 4 and 5. A bond is then formed by ultrasonic vibration of the bonding tool 90.

Figure 8:
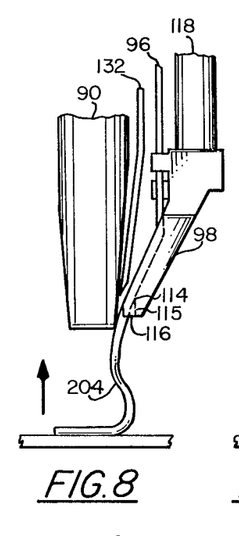
FIG. 8 shows a view of the bonding head with the conduit moving upwardly, providing a slight loop to the wire.

In FIG. 8 after the bond has been formed through the ultrasonic vibration of the tool 90, the bonding head 10 moves upwardly drawing the wire 96 out of the conduit 98. The wire pays out over edge 114 through channel 115 and the opening 116 and simultaneously through the blocks 102 and 106 over edge 110. This causes a working of the wire 96 to straighten it with respect to coil set since the wire moves through a sinuous or serpentine path. The path is of a compound curve derived from the lateral displacement of edges 110 and 114. It also causes the wire to be drawn over surface 114 which causes the perceptable arc, curve or loop 204. As the tool 90 is raised higher with the conduit 98, it continues to draw and provide the loop 204 formed over the edge 114.

Figures 9, 10, 11:
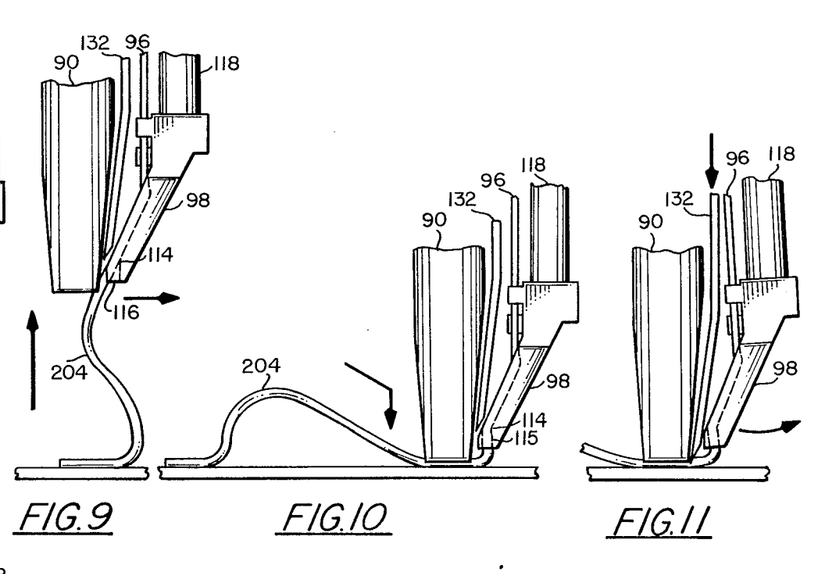
FIG. 9 shows the bonding head and conduit moving upwardly and laterally to provide a further loop.
FIG. 10 shows the downward movement of the bonding head and the conduit in order to provide a second bond.
FIG. 11 shows the bonding head with the tool still implaced over the wire to be bonded over the substrate and the cutter moving downwardly to partially cut the wire that has been bonded.

Thereafter, as seen in FIG. 9, the tool 90 and the conduit 98 move toward the second bond or toward the right as seen in FIG. 9 while at the same time maintaining an arc or the loop 204. It then moves downwardly with the bonding tool 90 impressing itself against the wire 96. After reaching the loop stop point of FIG. 9, the head 10 moves toward the next bond at the same height. The coordinated move downward of FIG. 10 and continuing move toward the next bond begins at about 40% of the distance between bonds, measured from the first bond. This is a typical movement, however it can be changed through computer menu choices. Thereafter as shown in FIG. 10, the wire 96 is held in place and a vibratory ultrasonic drive is provided through the transducer 70 in order to bond the wire 96 to the substrate.

After the final bond has been made, the tube 14 is moved further down in the Z direction as shown in FIG. 11. This causes the cutter 132 to move against the wire 96. At the same time, the bonding tool 90 and the conduit 98 are held in biased relationship against the wire 96 by means of the spring bias through spring 80 and the magnetic bias through the drive of the poles or coils 144 and 146. In other words, the tool 90 and the conduit 98 attached to the pin or depending connector 118 are allowed to move upwardly in relation to the cutter 132 as it cuts into the wire.

The cutter 132 is allowed to move down and cut the wire partially therethrough as seen in FIG. 11. The wire 96 when partially cut therethrough allows for the further subsequent severance.

The cutter 132 is between the conduit 98 and the bonding tool 90. As the Z motion continues downwardly by the drive on the tube 14, the cutter 132 tends to displace the conduit 198 backwardly as seen in FIGS. 10 and 11. This is due to the flexible connection provided by the connector 130. The connector 130 allowing the support 118 to flex away from the bonding tool 90 is enhanced by the angular displacement of the cutter 132 moving the conduit 98 backwardly to allow for the cut. In this manner, close bonding head 10 orientations can be provided so that the tool 90, conduit 98 and the cutter 132 can be implaced in very small places.

The tool 90 and conduit 98 are downwardly stopped by a mechanical projection on armature 142. Without this, the spring force would push the tool downward until it ran out of force. The stop is also the touchdown switch as set forth hereinafter, that the computer monitors in order to determine when the tool 90 is just reaching or departing the surface of the work. This switch is normally closed when the tool is in the air (i.e. against the stop rather than the work). This touchdown information is just a switch opening (z system going down) or closing (when going upward) at a certain point along the z axis. The computer saves that z address point to provide the following functions. It further produces the same amount of overtravel regardless of actual substrate height. During the cut move, it then counts a relative number of steps beyond where it is expected to sense the switch closure (a safety limit in effect). After the cut, it then counts the number of steps upward from where the tool leaves the surface of the bond, in order to draw out the exact amount of wire for the next bond.

Figure 12:
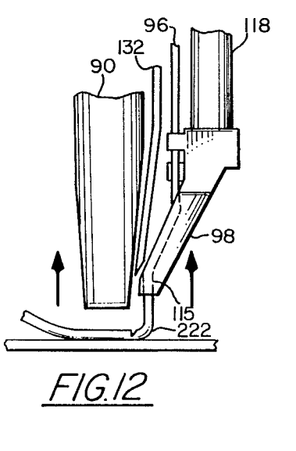
FIG. 12 shows an upward movement of the bonding tool and the head with the conduit paying out wire.

FIG. 12 shows the bonding tool 90 and pin or support 118 with the conduit 98 moving upwardly. At this time, the bond has been made of the wire 96 and the upward movement causes the bias on tool 90 and conduit 98 to allow it to move downwardly again in relationship to the fixed position of the cutter 132 that is fixed to the mechanical ground or main support 12 as shown. This main support apparatus 12 of course is connected to the mechanical ground as established through tube 14. Additionally, in the FIG. 12 showing it can be seen wherein a length of wire 222 has been paid out. This length of wire 222 will feed into the bonding tool 90 and will form another bond which is to be the first bond at another location.

Figure 13:
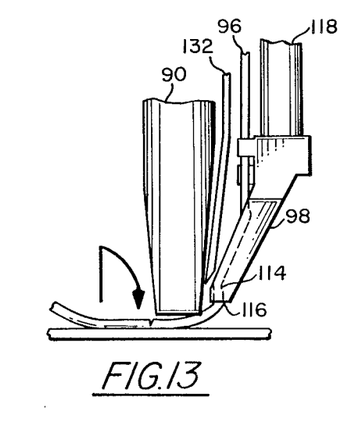
FIG. 13 shows the bonding head with the tool and conduit moving away from the bond and the cut in order to cleat the wire in the end of the bonding tool.

Looking at FIG. 13 it can be seen wherein the bonding tool 90 and depending support pin 118 have been moved upwardly while at the same time moving backwardly and downwardly away from the bond and the cut provided by the cutter 132. The bonding tool 90 then secures the wire 96 in the groove thereof through a cleating action by virtue of the fact that the end of the bonding tool or slot 92 of the bonding tool has a face 93 which receives the wire 96 thereagainst. Inasmuch as the wire 96 is maleable and has been distorted under the groove 92, due to the movement shown in FIGS. 12 and 13, it is cleated against surface 93.

Figure 14:
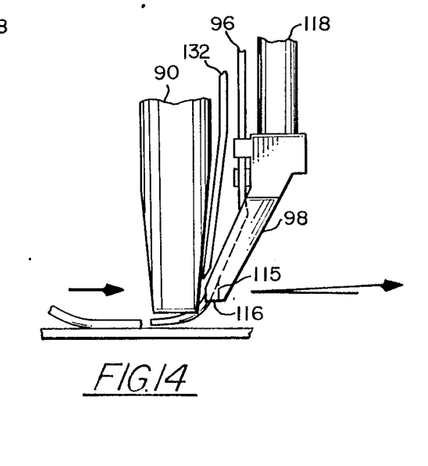
FIG. 14 shows the wire being severed with the wire in the end of the bonding tool.

The maintenance of the wire in groove 92 is further enhanced through the cleating action as seen in FIG. 14 when the bonding tool 90 with the distorted wire 96 partially in the groove 92 moves away from the cut of the wire and severs it. This movement is away from the cut wire and slightly upwardly to allow for displacement of the bond head 10 and the entire assembly while at the same time cleating the wire 96 firmly in the bonding tool groove 92 for bonding at the next location.

If the wire 96 becomes dislodged from the bonding tool groove 92 and is displaced laterally or in any particular direction, it will not be within the groove 92 for subsequent bonding. Of course, if the edges of the bonding tool outside of the groove 92 impinge against the wire 96 it then establishes a crimping and improper bonding. The wire does not extend into the full depth of groove 92 inasmuch as the groove is roughly a V shaped groove to enhance the cleating action of the distorted wire 96 in the groove.

The foregoing generally describes the operation when the bonding tool 90 is against a relatively stiff substrate. To enhance the operation of the bonding tool 90 in the bonding head 10, a relative movement limiting device is used to prevent the cutter 132 from passing beyond a particular point with respect to the bonding tool 90. This is provided by a limit switch having an adjustment to allow for the relative positions of the bonding tool and the cutter 132. Upon downward Z movement of the tube 14 driving the cutter 132 into the wire, it will not pass beyond a given point of the bonding tool 90 as biased by the biasing system.

To accomplish this, the bonding tool 90 and conduit 98 with the support tube 118 are connected to the four bar connection provided by plates 30 and 28. These are controlled for movement in an upwardly flexed manner to not pass beyond the limit switch. In particular, a limit contactor is shown with a contact being made through a contact 230 that is mechanically connected to the bonding tool 90 and the support 118. This contactor 130 for purposes of relative limited movement contacts a second contactor 232 connected to the mechanical ground that is shown as G. The contactor 232 is in turn mounted on an electrical insulator 234. An electrical insulator disc 236 is shown with a nut 238 securing the contactor 232 thereagainst. A lead 240 which is to the hot or current flow side of the line allows for a contact to be made and a limiting to be sensed through contactors 230 and 232, when contact is made.

Figures 17, 18:
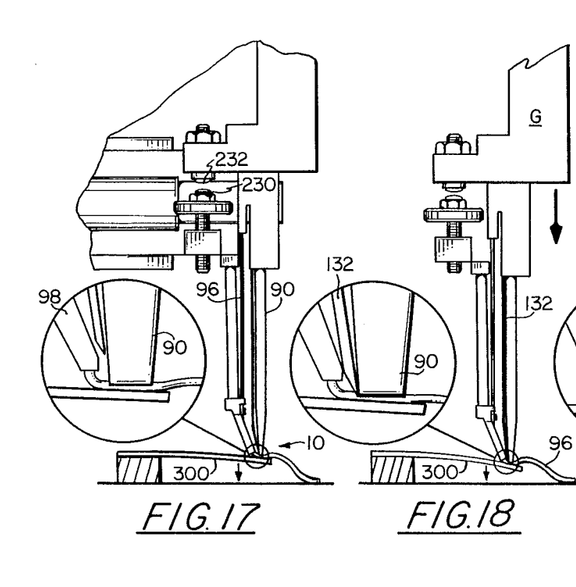
FIG. 17 shows a bond being performed from the view side as seen in FIG. 16, wherein a bond is being performed against a flexible substrate.
FIG. 18 shows the cutter initially cutting the wire.

Looking more specifically at FIGS. 17 through 21, it can be seen wherein the operation of the limit switch and bonding tool 90 in conjunction with the elements thereof has been shown. In particular, the showing is from the opposite from FIG. 6, namely that of FIG. 16. From FIG. 16 it can be seen that the operation of a bonding unit as exemplified in FIGS. 17 through 21 initiates with the bonding tool 90 being pressed against a wire 96. The wire 96 has been drawn from a reel of wire. In FIG. 17, the bonding tool head 90 is against the wire and has started the bonding operation. FIG. 17 shows a substrate 300 which can be the surface of a package terminal without sufficient support thereunder to which a wire is to be bonded to. As the bonding tool 90 presses against the substrate 300 it tends to bend downwardly. The resilience of the substrate bends under the net loads of the spring bias provided by the spring 80 and the magnetic coil biasing means.

After a bond has been made, the Z motion of the tube 14 causes the cutter 132 to move downwardly as with the main support apparatus as can be seen in FIG. 18. This also serves to displace wire conduit 98 similarly to the action in FIG. 11. As it moves downwardly, the cutter cuts partially through the wire 96. This partial cut can be seen by virtue of the fact that it is cut partially through the wire and a further degree of pressure against the resilient substrate 300 has taken place so that it has bent further downwardly.

Figures 19, 20:
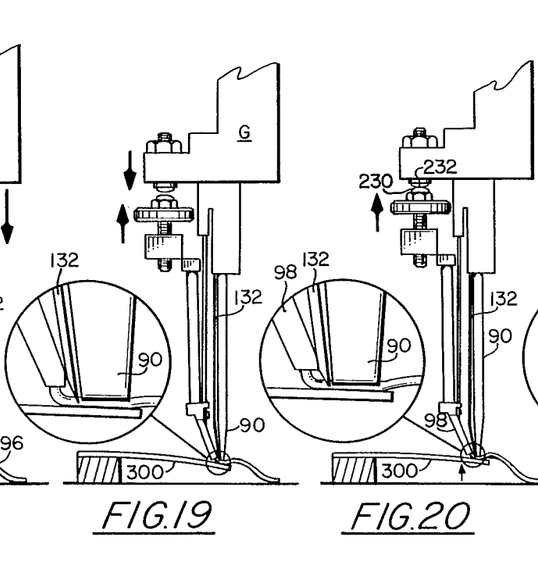
FIG. 19 shows a view of the cutter moving into the wire and displacing the substrate.
FIG. 20 shows a view of the cutter moving into the wire to the relative limit at which it and the bonding head do not move any further due to the limits shown therein stopping further movement of the cutter with respect to the bonding tool.
Figure 21:
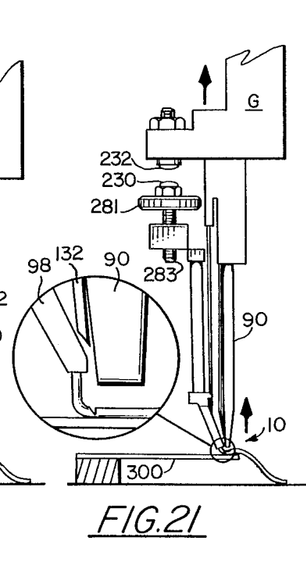
FIG. 21 shows a view of the bonding head with the cutter, conduit and bonding tool moving upwardly after a cut has been made without a movement of the bonding head laterally as seen in FIG. 13.

After the wire has been partially cut therethrough, the substrate 300 as shown in FIG. 19 begins to recoil backwardly inasmuch as the cutter 132 at this point is through the midsection of the wire. There is less wire to cut cross section and therefore less force required by the cutter 132. This lesser force required creates a situation wherein the substrate 300 responds by moving upwardly such that the relative distance between the bonding tool 90 and the cutter changes. In order to avoid further cutting, the bonding tool 90 which is connected to the limit switch contactor 230 creates a situation wherein contact is made and any further movement of the tube 14.

In FIG. 20 it can be seen where the resilience of the substrate 300 has caused the substrate to move upwardly and thereby lift the bonding tool 90 and conduit 98 to a point where the contactors 232 and 230 have made contact. At this point, the contactors cause the Z motion of the tube 14 to immediately stop. The Z motion of the tube 14 is directly connected to the cutter 132 and thereby the cutter is stopped from penetration. In effect, the distance between the end of the bonding tool 90 and the cutter movement when moving serves as the limiting factor as to the depth of cut even on a resilient substrate, such as substrate 300. After the contact has been made between contact 230 and 232 the Z motor attached to the tube 14 draws the entire device upwardly so as to withdraw the tool 90, conduit 98 and cutter 132 away from the surface and prepare for another bond.

Keeping in mind the fact that the cutter has made the cut and the wire can then be severed as shown in the prior description in FIGS. 7 through 14 it should be understood that the controlling relative function is the resilience of the substrate and the setting between contactors 230 and 232. The cutter should not move beyond the bonding tool but is only to move a relative distance with respect to the end of the bonding tool to prevent complete severance.

Adjustment as to the relative distance between the point at which contactors 230 and 232 make contact is established by the distance the contactor 230 is displaced initially from the contactor 232. This relative distance of course controls the distance in which the cutter 132 will pass with respect to the end of the bonding tool 90. This can be set by turning a knurled disk 281. The knurled disk 281 which is threaded to a screw member 283 allows the contactor 230 to be raised and lowered to adjust the operative relationship of the bonding tool 90 with the cutter 132.

The closing of the gap between contacts 230 and 232 by turning the knurled disk 281 causes the cutter 132 to penetrate to a lesser degree into the wire, inasmuch as contact will be made relative to the position of the bonding tool at a lesser depth of penetration of the cutter blade 132. Thus, accurate control is maintained of the cutter blade 132 as it moves into the wire. Also, even though a degree of resilience and attendant give is established with respect to the flexible substrate 300, the cutter 132 never cuts more deeply into the wire than the established relationship between the end of the cutter and the bonding tool. This allows a later severance and bonder head 10 functions as seen in FIGS. 9 through 14 and 17 through 21. In this manner, the wire is received in the cleating mechanism of the groove or notch 92 and retained through the cleating and holding thereof as established by the distortion of the aluminum wire holding it in the groove against the cleating surface 93.

From the foregoing, it can be seen that this invention is a substantial step over the art and should be read broadly in light of the claims. This is particularly true, inasmuch as it establishes a closely associated bonding head that incorporates wire working, providing a loop for subsequent bonding, as well as retention of the wire after it has been cut within the bonding tool head and additionally allows for bonding against a resilient compliantly giving surface or substrate.

We claim:

1. An ultrasonic wire bonder having a wire bonding tool that is connected to a transducer for ultrasonic wire bonding of a wire that is implaced under the tool for bonding it to a surface therebelow wherein the improvement comprises:
   delivery means for delivering wire to the end of said bonding tool having at least two surfaces extrinsic to the cross section of said wire bonding tool in displaced relationship from the axis over which the wire moves in order to work it in a direction to remove coil set from the wire.

2. The improvement as claimed in claim 1 wherein said delivery means for delivering said wire comprises:
   a channel having at least one of said displaced surfaces in alignment therewith for working the wire.

3. The improvement as claimed in claim 2 wherein the delivery means comprises:
   a serpentine channel path with an opening in proximate relationship to the end of the wire bonding tool.

4. The improvement as claimed in claim 2 wherein:
   said opening is configured with a surface to provide a loop to the wire when wire is drawn therefrom, and said delivery means is moved in an upward direction from where a wire bond has been made.

5. The improvement as claimed in claim 4 wherein:
   the angle of the channel and the opening therefrom is at an angle of five degrees or less from the axis of the tool.

6. The improvement as claimed in claim 1 further comprising:
   means for said delivery means to impart drag to the wire.

7. The improvement as claimed in claim 6 further comprising:
   a wire cutting tool that moves independently from the bonding tool and the wire delivery means so that when said wire delivery means is implaced with said bonding tool against a bonded wire surface, the cutter can move independently to cut a wire under said bonding tool.

8. The combination of a wire bonding tool and a wire delivery means in conjunction with a cutter comprising:
   a wire bonding tool for ultrasonic wire bonding connected to a transducer for ultrasonic movement of the wire bonding tool;

means for providing a variable mechanical load on said wire bonding tool;

means for delivering wire along a sinuous path to the end of said wire bonding tool for affecting the set of the wire having a plastic interface with the wire contacting surfaces; and wherein, said delivery means has an opening which can deliver wire to the end of said wire bonding tool.

9. The combination as claimed in claim 8 wherein said cutter comprises:

a cutter provided with independent relative movement from the bonding tool.

10. The combination as claimed in claim 8 wherein said delivery means comprises:

means to provide drag on the wire.

11. The combination as claimed in claim 10 wherein:

said variable mechanical loading means comprises electrical coil means for establishing a field and means within said field connected to said wire bonding tool which can be urged by the field to provide positive or negative loading to said bonding tool.

12. The combination as claimed in claim 11 further comprising:

a cutting tool connected independently of said wire bonder and said wire delivery means to move independently and in relative movement toward a bonded wire for cutting said wire as said bonding tool is independently sustained relative to said cutter under the load of said variable loading means.

13. The method of ultrasonically bonding a wire to a substrate of an electrical component comprising:

providing a bonding tool connected to a source of ultrasonic energy;

delivering wire to the end of said bonding tool;

working said wire in a path of movement formed at least in part with a plastic surface prior to delivery to the end of said bonding tool to eliminate at least in part some of the pre-established set of the wire while it was on a spool; and, ultrasonically bonding the wire to a substrate.

14. The method as claimed in claim 13 wherein said working of said wire comprises:

moving said wire over two surfaces in laterally displaced relationship to the path of movement over which said wire is worked.

15. The method as claimed in claim 14 wherein:

one of said surfaces is between a first surface and the end of said path of movement.

16. The method as claimed in claim 15 further comprising:

delivering said wire over said surface proximate the end of said path after a bond has been made at an angle to the axis of said wire bonding tool so as to provide an arcuate formation to said wire.

17. The method as claimed in claim 16 further comprising:

forming said arcuate formation between the bond and a second bond to be formed through upward and lateral displacement over said substrate.

18. The method as claimed in claim 17 further comprising:

forming a second bond connected to said first bond at the end of said arcuate formation which has been formed; and, cutting said wire after said second bond has been formed by a cutter that moves independently from said wire bonding tool and said wire delivery means.

19. The method as claimed in claim 18 further comprising:

moving said bonding tool by an X, Y, Z and T axis positioning means; and, cutting said wire by causing a cutter to move independently of said wire bonding tool and which is attached directly to the X, Y, Z and T axis positioning means of said wire bonder.

20. The method as claimed in claim 19 further comprising:

magnetically biasing said bonding tool by electrical coil means causing a magnetic bias to an armature connected to said bonding tool.

21. The method as claimed in claim 20 further comprising:

cutting said wire after said second bond has been established by at least partially cutting said bond while magnetically biasing the load on said bonding tool to diminish the load of said bonding tool on said wire as said cutter moves in relative movement against said wire.

22. A method for ultrasonically bonding a wire to a substrate at a first bond and to another substrate portion at a second bond comprising:

providing a wire to be bonded;

providing a bonding tool;

delivering wire to be bonded through a wire delivery means extrinsic to said bonding tool while at the same time working coil set from said wire;

ultrasonically bonding wire to said substrate at a first bond by said bonding tool;

moving said wire delivery means and said bonding tool upwardly from said first bond while simultaneously applying an arcuate bend to said wire as it is being drawn from said wire delivery means;

moving said bonding tool and said wire delivery means to a position proximate to where said second bond is to be made;

bonding said second bond while maintaining the arcuate bend between said first and second bond; and, cutting said wire after said second bond to provide a bonded wire loop between said first and second bonds.

23. The method as claimed in claim 22 further comprising:

providing drag on the wire as it moves through said wire delivery means sufficient to prevent wire from moving directly through said wire delivery means by gravitational forces.

24. The method as claimed in claim 22 further comprising:

removing coil set by means of moving said wire through a serpentine path in said delivery means.

25. The method as claimed in claim 22 further comprising:

cutting said second bond through the force of a cutting tool means being applied directly through movement of the cutting tool support means in a connected relationship through Z positioning means of the bonding tool, said delivery means, and cutting means.

26. The method as claimed in claim 22 further comprising:

biasing said bonding tool against a wire to be bonded by means of a spring biasing means; and, providing supplemental negative or positive bias through magnetic variable biasing means connected to said bonding tool.

27. Wire bonding apparatus comprising:
a wire bonding main support means connected for movement at least in part in a Z axis;
a wire bonding tool attached to a transducer which is connected for flexible movement with respect to said Z axis;
wire conduit means connected for flexible movement with respect to said Z axis for conducting wire toward the end of said wire bonding tool; and,
a wire bonding cutting blade for severing wire bonds that have been made by said wire bonding tool, which is connected for movement directly with said main support means in the direction of said Z axis.

28. The apparatus as claimed in claim 27 wherein:
said wire bonding tool and said wire conduit means are connected for like relative movement with respect to said Z axis.

29. The apparatus as claimed in claim 27 wherein:
said wire bonding tool and said wire conduit are connected to a flexible support means which moves to provide relatively parallel movement of said wire bonding tool and said conduit means.

30. The apparatus as claimed in claim 29 wherein:
said support means for said wire bonding tool and said conduit comprise a four bar link support, supported at the respective ends of said four link members; and,
said four link members are biased by a biasing means.

31. The apparatus as claimed in claim 30 wherein said biasing means comprise:
a spring.

32. The apparatus as claimed in claim 30 wherein:
said biasing means comprises at least in part a magnetic field force provided by magnets in combination with an armature connected to said wire bonding tool.

33. Apparatus for ultrasonically bonding a wire to a substrate having a wire bonding tool and wire feed conduit comprising:
means for supporting said wire bonding tool in conjunction with an ultrasonic transducer connected to said bonding tool;
means for supporting said conduit for feeding wire proximate to the end of said wire bonding tool;
means for supporting a cutter blade, for cutting a wire which has been bonded, for independent movement as to said wire bonding tool and conduit support means;
means for providing a bias to said wire bonding tool when implaced against a wire;
means to cause movement of said wire cutter downwardly in relative movement to said wire bonding tool and said conduit means to a given cutting point; and,
means for terminating said cutting movement.

34. The apparatus as claimed in claim 33 wherein said means for terminating said movement comprises:
a limit switch which makes contact after a given degree of relative movement of said wire bonding tool has taken place with respect to said wire cutting tool.

35. The apparatus as claimed in claim 34 wherein:
said support means for said wire cutter comprises a main support means to which said wire bonding tool and said conduit are connected for relative movement therewith in the Z direction of movement.

36. The apparatus as claimed in claim 35 wherein:
said wire bonding tool is biased at least in part for movement in the Z direction of said support means by magnetic biasing means in connected relationship thereto.

37. The apparatus as claimed in claim 33 wherein:
said cutter blade is disposed between said conduit and said wire bonding tool and upon relative movement for cutting said wire, said cutter displaces said conduit away from said wire bonding tool.

38. The apparatus as claimed in claim 33 wherein said conduit comprises:
a first and second surface in displaced relationship providing a sinuous path over which said wire is drawn for purposes of removing wire set; and wherein,
said wire after it has been bonded can be moved over said second surface to provide a loop to said wire through the working formation of said wire as it moves thereagainst.

39. The apparatus as claimed in claim 33 further comprising:
means within said wire bonding tool for cleating said wire and holding it therein after said wire has been severed from its bond.

40. The apparatus as claimed in claim 39 wherein:
said cleating and holding means comprise a groove at the end of said tool having walls which slope inwardly to a dimension between them less than the diameter of said wire.

41. A method for bonding wire to a substrate having at least two respective bonds comprising:
providing a conduit for wire to be bonded wherein said conduit is formed with a first and second surface in laterally displaced relationship over which said wire moves to effect a working of the wire;
ultrasonically bonding said wire that is removed from said conduit at a first bond point;
lifting said bonding tool and said conduit upwardly away from said first bond;
withdrawing said wire from said conduit to provide a loop to said wire;
moving said wire bonding tool and said conduit downwardly in a distal location from said first bond to provide a second bond;
ultrasonically bonding said second bond;
moving a cutter blade downwardly between said bonding tool and said conduit while at the same time moving said conduit away from said bonding tool;
cutting said wire at least in part by said cutter; and,
severing said wire where it has been cut.

42. The method as claimed in claim 41 further comprising:
moving said bonding tool and said conduit upwardly a sufficient distance to pull a length of wire from said conduit of a length required for another bond before severing said wire.

43. The method as claimed in claim 42 further comprising:
moving said bonding tool with respect to said wire that has been withdrawn from said conduit and implacing said wire into a groove of said bonding tool; and, moving said bonding tool with said wire therein away from said portion which has been cut so as to cleat said wire in said bonding tool prior to severance to provide for a subsequent bonding of said wire by said bonding tool.

44. The method as claimed in claim 41 further comprising:
displacing said conduit by means of an angular displacement away from said bonding tool through the movement of said cutter between said bonding tool and said conduit.

45. The method of bonding a wire to a substrate comprising:
providing main support means for movement in a Z axis for supporting a wire bonding tool, a conduit for feeding wire to said wire bonding tool and a cutter blade wherein said wire bonding tool and said conduit are supported independently of said cutter blade;
moving said wire bonding tool into biased relationship against a wire to be bonded to said substrate;
ultrasonically bonding said wire to said substrate by said wire bonding tool;
moving said cutter for at least partially cutting said wire by means of said major support means moving said cutter in the Z axis in relative relationship to said wire bonding tool and said conduit;
providing a means for stopping said cutter with respect to said wire bonding tool;
stopping said cutter; and,
withdrawing said cutter, wire bonding tool and conduit means and thereafter severing said wire by movement of said wire bonding tool away from said cut portion of the wire.

46. The method as claimed in claim 45 further comprising:
securing said wire into the end of said wire bonding tool after said cutter has cut said wire, and then severing said wire at said cut.

47. The method as claimed in claim 45 further comprising:
placing said cutter between said conduit and said wire bonding tool; and,
displacing said conduit away from said wire bonding tool during the cutting of said wire.

48. The method as claimed in claim 45 further comprising:
providing a limit switch to check the relative movement of said cutter with respect to said wire bonding tool when said cutter passes to a certain point with respect to said wire bonding tool.

49. The method as claimed in claim 45 further comprising:
allowing said wire bonding tool to move downwardly against a flexible substrate in a manner whereby said cutter moves with respect thereto to cut the wire at a limited point with respect to said wire bonding tool.

* * * * *